(12) United States Patent
Tan et al.

(10) Patent No.: US 7,413,992 B2
(45) Date of Patent: Aug. 19, 2008

(54) TUNGSTEN SILICIDE ETCH PROCESS WITH REDUCED ETCH RATE MICRO-LOADING

(75) Inventors: Sok Kiow Tan, Newark, CA (US); Shenjian Liu, Fremont, CA (US); Harmeet Singh, Fremont, CA (US); Sam Do Lee, Fremont, CA (US); Linda Fung-Ming Lee, Redwood City, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 11/440,163

(22) Filed: May 23, 2006

(65) Prior Publication Data

US 2006/0273072 A1    Dec. 7, 2006

Related U.S. Application Data

(60) Provisional application No. 60/686,787, filed on Jun. 1, 2005.

(51) Int. Cl.
*H01L 21/302* (2006.01)
(52) U.S. Cl. .................. 438/706; 438/659; 438/714; 438/719; 438/738; 216/60; 216/79; 156/345
(58) Field of Classification Search .......... 438/706; 134/1.1; 216/60
See application file for complete search history.

(56) References Cited

U.S. PATENT DOCUMENTS

| 626,996 | A | * | 6/1899 | Chang et al. ............... 60/443 |
| 5,843,847 | A | * | 12/1998 | Pu et al. ..................... 438/723 |
| 5,851,926 | A | * | 12/1998 | Kumar et al. ............... 438/714 |
| 6,080,681 | A | | 6/2000 | Tabara |
| 6,124,212 | A | | 9/2000 | Fan et al. |
| 6,776,851 | B1 | | 8/2004 | Singh et al. |
| 6,797,188 | B1 | * | 9/2004 | Shen et al. ................. 216/46 |
| 6,869,885 | B1 | * | 3/2005 | Bowling ..................... 438/706 |
| 6,897,154 | B2 | * | 5/2005 | Leung et al. ............... 438/706 |
| 6,939,811 | B2 | | 9/2005 | Kamp et al. |

(Continued)

FOREIGN PATENT DOCUMENTS

EP    0 837 497 A2    4/1998

*Primary Examiner*—Binh X Tran
*Assistant Examiner*—Maki Angadi
(74) *Attorney, Agent, or Firm*—Martine Penilla Gencarella, LLP

(57) ABSTRACT

The embodiments provides an improved tungsten silicide etching process with reduced etch rate micro-loading effect. In one embodiment, a method for etching a layer formed on a substrate is provided. The method includes providing a substrate into a plasma processing chamber, the substrate having a metal silicide layer formed thereon and a patterned mask defined over the metal silicide layer. The method also includes supplying an etching gas mixture of a fluorine-containing gas, a chlorine-containing gas, a nitrogen-containing gas, and an oxygen-containing gas to the plasma processing chamber, wherein the ratio of the nitrogen-containing gas to the fluorine-containing gas is between about 5 to about 15. In addition, the method includes generating a plasma in the plasma processing chamber using the supplied etching gas mixture to etch the metal silicide layer in regions not covered by the patterned mask, the patterned mask defining dense regions and isolated regions, wherein the generated plasma is configured to remove the metal silicide layer in the dense regions and the isolated regions at a reduced etch rate micro-loading.

16 Claims, 4 Drawing Sheets

U.S. PATENT DOCUMENTS

| | | | |
|---|---|---|---|
| 2001/0020516 A1* | 9/2001 | Khan et al. | ............... 165/61 |
| 2003/0049876 A1 | 3/2003 | Mori et al. | |
| 2004/0129674 A1* | 7/2004 | Bease et al. | ............... 216/67 |
| 2005/0064714 A1 | 3/2005 | Mui et al. | |

* cited by examiner

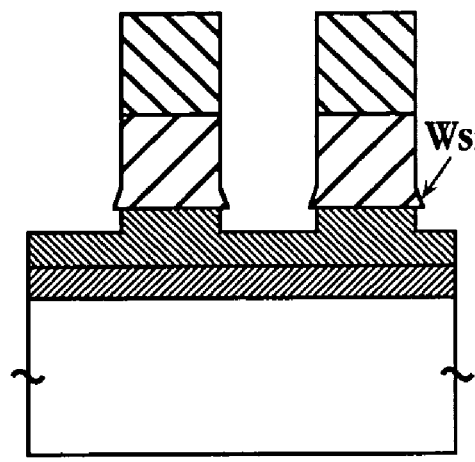
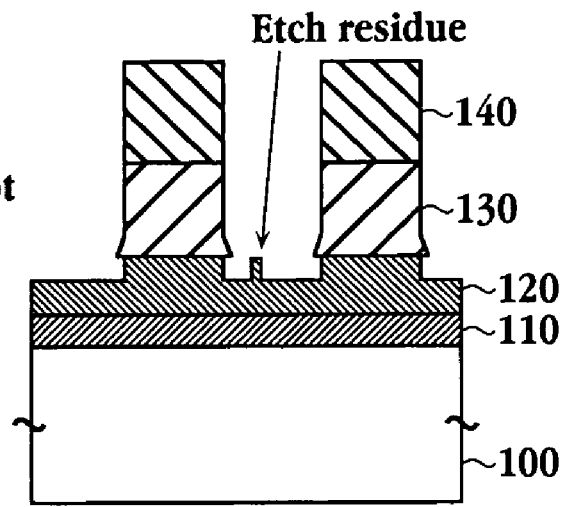
Fig. 3A     Fig. 3B
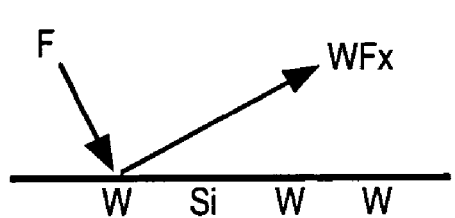
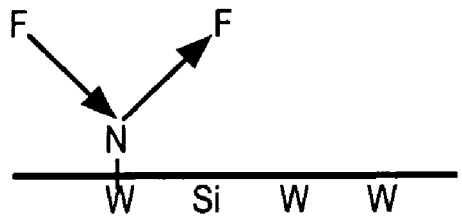
Fig. 4A     Fig. 4B

TUNGSTEN SILICIDE ETCH PROCESS WITH REDUCED ETCH RATE MICRO-LOADING

CLAIM OF PRIORITY

This application claims priority of a provisional application with Application No. 60/686,787, titled "Tungsten Silicide Etch Process With Reduced Etch Rate Micro-loading," dated Jun. 1, 2005, which is incorporated herein by reference.

BACKGROUND

In the fabrication of semiconductor-based devices (e.g. integrated circuits or flat panel displays), layers of material are alternately deposited onto and etched from a substrate surface (e.g., the semiconductor wafer or the glass panel). As is well known in the art, the deposition of material layer(s) and etching of the material layer(s) may be accomplished by a variety of techniques, including plasma-enhanced deposition and etching. In plasma-enhanced deposition or etching, the actual deposition or etching of the substrate takes place inside a plasma processing chamber. During the deposition or etching process, a plasma is formed from a suitable source gas to deposit a material layer on the substrate or to etch areas of substrate that are unprotected by the etch mask, leaving behind the desired pattern.

Silicide films are used to provide low resistance interconnection paths which are important in order to fabricate dense, high performance devices. One structure is a polycide gate of the MOS transistor. It consists of a refractory metal silicide (e.g., $WS_2$, $TiSi_2$, $MoSi_2$, or $TaSi_2$) on top of a doped poly-silicon layer. In an example process, such a structure reduces the interconnect resistivity to less than the 15-30 ohms/square exhibited by doped poly-silicon that has no silicide. As minimum geometries decrease, interconnect resistances increase. For technologies with minimum geometries of about half a micron, introducing a refractory metal polycide process significantly lowers gate interconnect resistance. In minimum geometry features, tungsten silicide is the material of choice for its low sheet resistances and thermal stability.

The current existing tungsten silicide etching process has a severe etch rate micro-loading problem. Tungsten silicide in an isolated feature area is etched at a higher rate than in the dense feature area. Due to the severe degree of micro-loading, longer over-etch operations are required at the expense of increasing the risk of gate oxide punch through, which reduces device yield.

In view of the foregoing, there is a need for a method that provides an improved tungsten silicide etching process with a reduced etch rate micro-loading effect.

SUMMARY

The embodiments described below provides an improved tungsten silicide etching process with a reduced etch rate micro-loading effect. It should be appreciated that the present invention can be implemented in numerous ways, including in different plasma etching systems. Several inventive embodiments of the present invention are described below.

In one embodiment, a method for etching a layer formed on a substrate is provided. The method includes providing a substrate into a plasma processing chamber, the substrate having a metal silicide layer formed thereon and a patterned mask defined over the metal silicide layer. The method also includes supplying an etching gas mixture of a fluorine-containing gas, a chlorine-containing gas, a nitrogen-containing gas, and an oxygen-containing gas to the plasma processing chamber, wherein the ratio of the nitrogen-containing gas to the fluorine-containing gas is between about 5 to about 15.

In addition, the method includes generating a plasma in the plasma processing chamber using the supplied etching gas mixture to etch the metal silicide layer in regions not covered by the patterned mask, the patterned mask defining dense regions and isolated regions, wherein the generated plasma is configured to remove the metal silicide layer in the dense regions and the isolated regions at a reduced etch rate micro-loading.

In another embodiment, a method for etching a layer formed on a substrate is provided. The method includes providing a substrate into a plasma processing chamber with an RF power supply disposed above the plasma processing chamber and a bias power supply coupled to a substrate support, wherein the patterned substrate is disposed on the substrate support, the substrate having a metal silicide layer formed thereon and a patterned mask defined over the metal silicide layer. The method further includes supplying an etching gas mixture of a $NF_3$ gas, a $Cl_2$ gas, an $N_2$ gas, and an $O_2$ gas to the plasma processing chamber, wherein the ratio of the $N_2$ gas to the $NF_3$ gas is between about 5 to about 15.

In addition, the method includes generating a plasma in the plasma processing chamber using the supplied etching gas mixture to etch the metal silicide layer in regions not covered by the patterned mask, the patterned mask defining dense regions and isolated regions, wherein the generated plasma is configured to remove the metal silicide layer in the dense regions and the isolated regions at a reduced etch rate micro-loading.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 3A shows tungsten silicide foot.

FIG. 3B shows tungsten silicide etch residue between features.

FIG. 4A shows fluorine radical etching $WSi_x$ surface.

FIG. 4B shows fluorine radical not being able to etch nitrogen-passivated $WSi_x$ surface.

DETAILED DESCRIPTION OF THE EXEMPLARY EMBODIMENTS

Several exemplary embodiments for an improved tungsten silicide etching process will now be described. It will be apparent to those skilled in the art that the present invention may be practiced without some or all of the specific details set forth herein.

Figure 1:
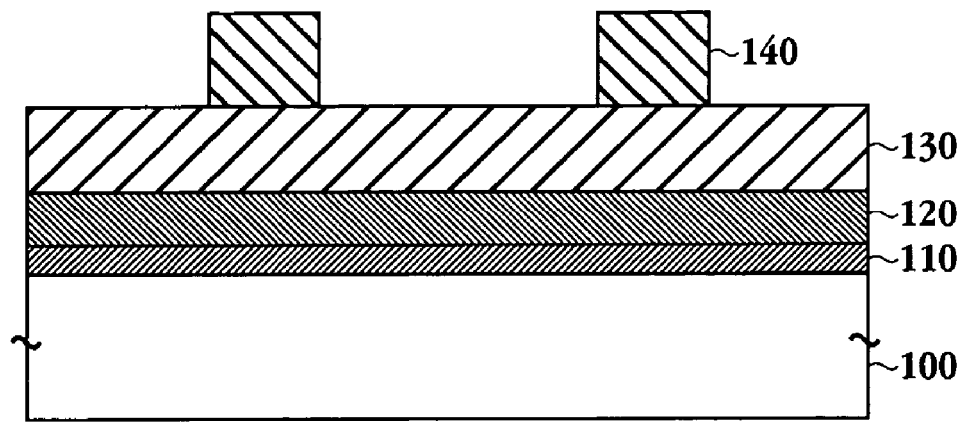
FIG. 1 shows an exemplary gate stack with tungsten silicide and photomask on a substrate.

FIG. 1 shows an exemplary gate stack with tungsten silicide and photomask on a substrate 100. The gate stack can be used to form various types of devices. For instance, some memory devices, such as DRAM, may use this starting structure. In the exemplary gate stack, an oxide layer 110 is deposited on the substrate 100. On top of the oxide layer 110 is a polysilicon layer 120. A tungsten silicide layer 130 is deposited above the polysilicon layer 120. A patterned photoresist layer or hard mask layer 140 is formed over the tungsten silicide layer 130. Examples of materials that can be used for hard mask layer include silicon dioxide, silicon nitride, amorphous carbon, etc.

Some tungsten silicide etching processes have severe micro-loading effects. Micro-loading effects describe the difference in etch rate in the area with dense features and in the area with isolated features on a substrate. For some tungsten silicide etching processes, tungsten silicide ($WSi_x$, x~2) is etched at a significantly higher rate in the isolated area than in the dense area.

Figure 2A:
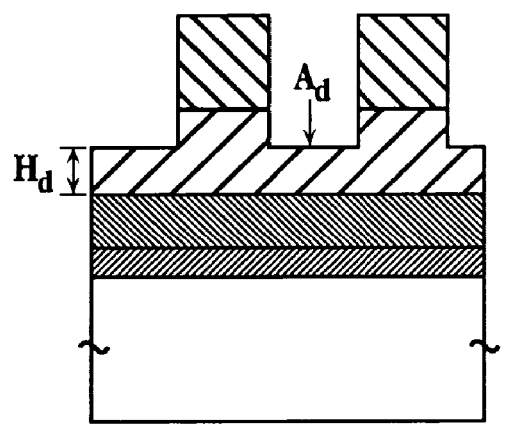
FIG. 2A shows etched tungsten silicide in the dense feature area.
Figure 2B:
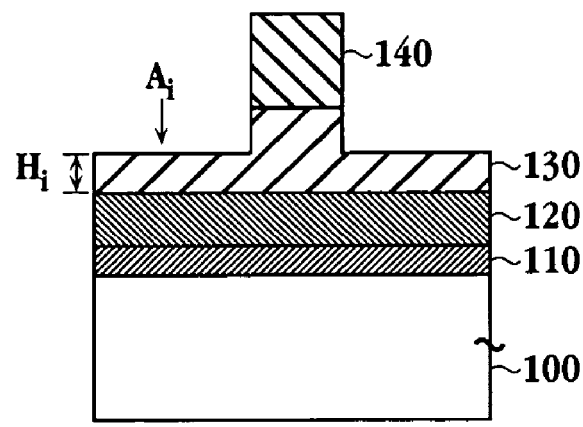
FIG. 2B shows etched tungsten silicide in the isolated feature area.

FIGS. 2A and 2B show partially etched tungsten silicide in the dense feature area (FIG. 2A) and in the isolated feature area (FIG. 2B). The severity of micro-loading effects can be compared by etch rate micro-loading, which is calculated first by subtracting the remaining tungsten silicide thickness in the dense area (Hd) from the remaining tungsten silicide thickness in the isolated area (Hi) and then dividing the result of subtraction by the average tungsten silicide thickness in the dense area and in the isolated area. Equation (1) shows the formula.

$$\text{Etch rate micro-loading} = (Hi-Hd)/((Hi+Hd)/2) \times 100\% \quad (1)$$

For conventional tungsten silicide etching process, micro-loading can be as high as 40%.

In the isolated feature area (FIG. 2B), the $WSi_x$ surface ($A_i$) is more open and is more exposed to the etching chemistry. In contrast, in the dense feature area (FIG. 2A), the area $A_d$ between the features relatively is less accessible to the etching chemistry as the area $A_i$ near the isolated feature. Therefore, the etching rate in the dense area is relatively lower than the etching rate in the isolated area. The difference in etching rates in these two areas results in micro-loading. As described above for some tungsten silicide etching processes, the etch rate micro-loading can be as high as 40%. Due to the severe degree of micro-loading, longer over-etch operations are required to ensure that tungsten silicide between features in the dense area is cleared everywhere across the substrate (or wafer). Longer over-etch can result in gate oxide punch through in the isolated feature area. Gate oxide punch through would result in yield loss. In addition to gate oxide punch through, tungsten silicide foot or etch residue are seen on wafers that went through conventional tungsten silicide etch process if the over etch is not sufficient. FIGS. 3 (A) and (B) show schematic drawings of tungsten silicide foot (FIG. 3A) and etch residue (FIG. 3B). Tungsten silicide foot is a term used to describe a post-etch tungsten silicide profile where tungsten silicide near the tungsten silicide and polysilicon interface is wider than the rest of the tungsten silicide. Tungsten silicide foot and etch resides between the features can affect gap filling and can reduce device yield. Therefore, it is very desirable to have a tungsten silicide etching process that has a minimal micro-loading effect to eliminate gate oxide punch through, tungsten silicide foot and etch residues.

The process in accordance with one embodiment utilizes a fluorine-containing gas, such as $NF_3$, $SF_6$, $C_2F_6$, or $CF_4$, a chlorine-containing gas, such as $Cl_2$, or HCl, a nitrogen-containing gas, such as $N_2$, or $N_2O$, an oxygen-containing gas, such as $O_2$, and an optional inert gas, such as He, Ar, Ne, Kr, or Xe. Fluorine radicals from the fluorine-containing gas and chlorine radicals from chlorine-containing gas provide etching species that are particularly well suited to etch $WSi_x$. Fluorine radicals are more active than chlorine radicals in etching $WSi_x$. In accordance with one embodiment, chlorine radicals are needed during etch, since they can help form an etch polymer to protect the etched feature sidewalls from etching by fluorine radicals. Oxygen-containing gas helps the dissociation of fluorine-containing gas, chlorine-containing gas, and nitrogen-containing gas. Nitrogen-containing gas helps to slow down the $WSi_x$ etching in the open area (or isolated feature area).

In one example, the fluorine-containing gas to chlorine-containing gas flow rate ratio is at between about 0.3 to about 3, preferably between about 0.5 to about 1.5. The fluorine-containing gas to oxygen-containing gas ratio is at between about 1 to about 10, preferably between about 5 and about 7. The nitrogen-containing gas to fluorine-containing gas ratio is at between about 5 to about 15, preferably between about 6 to about 10, and most preferably between about 7 to about 9. Inert gas flow is between 0 sccm (standard cubic centimeter per minute) to about 200 sccm. The total gas mixture flow is between about 150 sccm to about 1000 sccm, and preferably between about 300 sccm to about 600 sccm. Wafer temperature is between about 20° C. to about 75° C., preferably between about 25° C. to about 60° C. The process pressure is between about 3 mTorr to about 15 mTorr. The power is between 200 watts to about 1000 watts. The substrate bias voltage is between about 100 volts to about 300 volts, and preferably between about 100 volts to about 200 volts. In one embodiment, the resulting plasma density is between about $1E^9$ to about $1E^{11}$ per $cm^3$.

In one specific embodiment, the fluorine-containing gas is $NF_3$, the chlorine-containing gas is $Cl_2$, the oxygen-containing gas is $O_2$, the nitrogen-containing gas is $N_2$ and there is no inert gas in the gas mixture.

$N_2$ is mainly used to passivate the $WSi_x$ surface from the fluorine etching chemistry. FIG. 4A shows the $WSi_x$ surface being etched by fluorine. FIG. 4B shows certain W surface sites being passivated (or protected) by nitrogen and not being etched by fluorine. By increasing $N_2$ flow rate, a larger portion of W surface sites are protected (or passivated) from the fluorine radicals. For the isolated feature area, such as the area $A_i$ shown in FIG. 2B, more W surface sites are accessible to nitrogen and can be protected by nitrogen, compared to the W surface sites between dense features (or in area $A_d$ shown in FIG. 2A). Therefore, the increased nitrogen in the gas mixture protects WSix surface in the isolated feature area from aggressive fluorine radical attacks and slows down the etching rate in the isolated feature area. This increased nitrogen protection in the isolated feature area compensates for the increased etching rate in this area due to its exposure to the etching chemistry. On the other hand, the area $A_d$ (as shown in FIG. 2A) between the features in the dense feature area is less exposed to the nitrogen protection; therefore, the etching rate is reduced to a lesser degree than the isolated feature area. However, the etch rate of the dense feature area is also less than the isolated feature area due to its less exposure to the etching chemistry. Therefore, the increase nitrogen in the gas mixture significantly reduces or completely removes etch rate micro-loading. In one embodiment, the improved etching method reduces the tungsten silicide etch rate micro-loading to between about 0% to about 20%. In another embodiment, the improved etching method reduces the tungsten silicide etch rate micro-loading to between about 0% to about 10%.

Figures 5A, 5B:
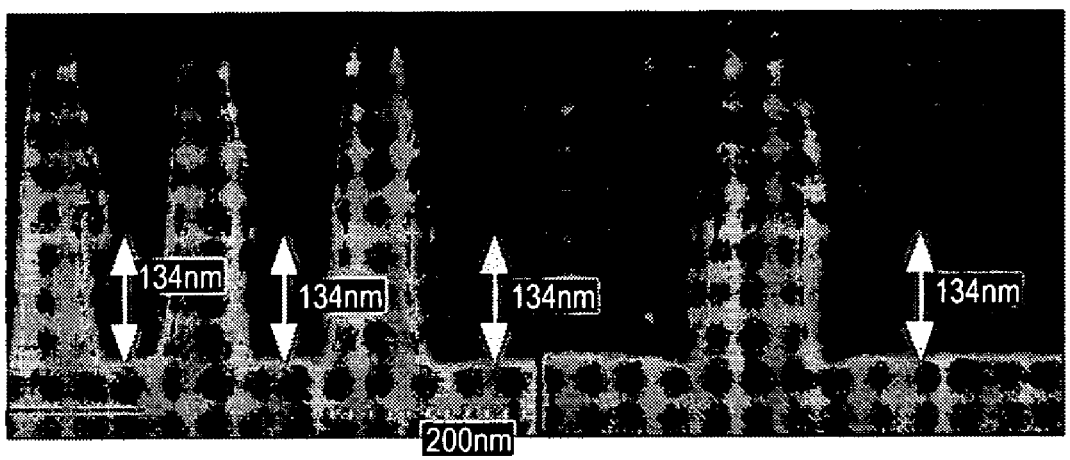
FIG. 5A shows etched gate stack in the dense feature area.
FIG. 5B shows etched gate stack in the isolated feature area.

FIGS. 5A and 5B show side-by-side scanning electron microscope (SEM) photos of cross-sectional samples of dense features (FIG. 5A) and isolated feature (FIG. 5B) taken from an etched wafer. The tungsten silicide etched thickness in the dense feature area (FIG. 5A) is about 134 nm. The tungsten silicide etched thickness in the isolated feature area (FIG. 5B) is also about 134 nm. Almost zero etch rate micro-loading has been achieved by the new tungsten silicide etching process.

Due to the almost zero etch rate micro-loading process capability, extended overetch is not required and gate oxide punch through is greatly reduced. In addition, tungsten silicide foot and etch residue are also greatly reduced.

Figure 6:
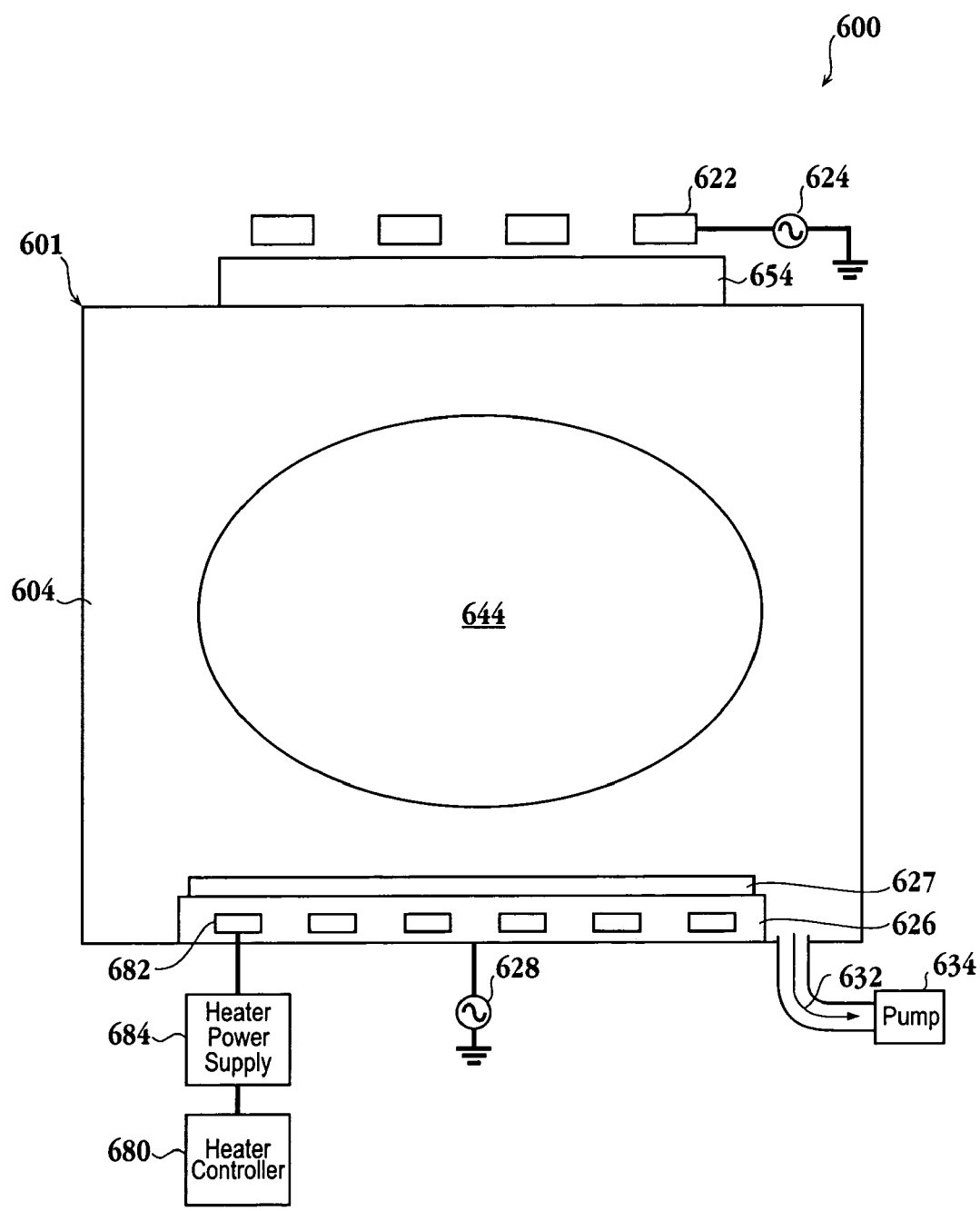
FIG. 6 shows an exemplary plasma etching system to etch tungsten silicide.

Tungsten silicide etching described above can be performed in various types of etching chambers. FIG. 6 is a schematic view of a plasma processing system 500, including a plasma processing reactor 601 that can be used to etch tungsten silicide with the process described above. The plasma processing reactor 601 is an inductively coupled plasma etching reactor and includes a plasma processing chamber 604. A radio frequency (RF) power supply 624 and a RF bias power supply 628 provide power to create and to influence the plasma 644 created within plasma chamber 604. In one embodiment, the RF power supplied by power supply 624 is at about 13.56 MHz. The RF power supply 624 can be controller by a power controller (not shown) and be tuned by a RF match network (not shown). RF power supply 624 provides power to a coil 622 located near the plasma chamber 604. An, RF transparent window 654 is provided to separate coil 622 from plasma chamber 604 while allowing energy to pass from coil 622 to plasma chamber 604.

The RF bias power supply 628 is configured to supply an RF signal to an electrostatic chuck electrode 626 located within the plasma chamber 604 creating a direct current (DC) bias above electrode 626 which is adapted to receive a substrate 627, such as a semiconductor wafer workpiece or a glass panel that is to be processed. The RF bias power supply 628 can be controller by a power controller (not shown) and be tuned by a RF match network (not shown). The plasma processing reactor includes a gas supply mechanism (not shown), which includes a source or sources of etchant gas or gases (not shown) attached via a gas manifold (not shown) to supply the proper chemistry required for the etching process to the interior of the plasma chamber 604. A gas exhaust 632 is coupled to an exhaust pump 634 to remove reactant gas and particles from within the plasma chamber 604 and to maintain a particular pressure within plasma chamber 604.

A temperature controller 680 controls the temperature of heaters 682 provided within the chuck 626 by controlling a heater power supply 684. In general terms, in plasma chamber 604, substrate etching is achieved by exposing substrate 627 to ionized gas compounds (plasma) under vacuum. The etching process starts when the gases are conveyed into plasma chamber 604. RF power delivered by coil 622 ionizes the reactive gases, which includes a fluorine-containing gas, a chlorine-containing gas, an oxygen-containing gas, a nitrogen-containing, and an optional inert gas. The power delivered by electrode 626 induces a DC bias on substrate 627 to control the direction and energy of ion bombardment of substrate 627. During the etching process, the plasma reacts chemically with the surface of the substrate 627 to remove material not covered by a mask.

In one preferred embodiment of the invention, a suitable plasma processing tool is the 2300™ Versys® Etch System, as provided by Lam Research Corporation of Fremont, Calif. Other details of the plasma processing chamber shown in FIG. 6 can be found in commonly assigned U.S. Pat. Nos. 6,939,811 and 6,776,851, which are incorporated by reference. In addition to tungsten silicide, the above described chemistry can also be used to etch other metal silicides, such as $TiSi_2$, $MoSi_2$, or $TaSi_2$. In one embodiment, the $WSi_x$ layer is non-stoichiometric and can contain other metals or alloys.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for etching a layer formed on a substrate, comprising:

providing a substrate into a plasma processing chamber, the substrate having a metal silicide layer formed thereon and a patterned mask defined over the metal silicide layer, wherein the metal silicide layer is part of a gate stack;

supplying an etching gas mixture of a fluorine-containing gas, a chlorine-containing gas, a nitrogen-containing gas, and an oxygen-containing gas to the plasma processing chamber, wherein a ratio of the nitrogen-containing gas to the fluorine-containing gas is between about 6 to about 10, a ratio of the fluorine-containing gas to the chlorine-containing gas being between about 0.5 to about 1.5 and a ratio of the fluorine-containing gas to the oxygen-containing gas being between about 5 to about 7; and generating a plasma in the plasma processing chamber using the supplied etching gas mixture to etch the metal silicide layer in regions not covered by the patterned mask, an RF power between about 200 watts to about 1000 watts being provided to generate the plasma, an RF bias power supply providing the substrate with a direct current (DC) bias voltage between about 100 volts to about 300 volts, wherein the DC bias voltage is used to control direction and energy of ion bombardment toward the substrate, the patterned mask defining dense regions and isolated regions, wherein the generated plasma is configured to remove the metal silicide layer in the dense regions and the isolated regions at a reduced etch rate micro-loading to reduce gate oxide punch through of the gate stack.

2. The method of claim 1, wherein the ratio of nitrogen-containing gas to the fluorine-containing gas between about 6 to about 10 reduces etch rate micro-loading effect on the substrate.

3. The method of claim 1, wherein the total etching gas mixture flow is between about 150 sccm to about 1000 sccm, the wafer temperature is between about 20° C. to about 75° C., the plasma processing chamber pressure is between about 3 mTorr to about 15 mTorr.

4. The method of claim 1, wherein the metal silicide is tungsten silicide.

5. The method of claim 1, wherein the gas mixture further comprises an inert gas, wherein the inert gas is selected from the group consisting of He, Ar, Ne, Kr and Xe.

6. The method of claim 1, wherein the fluorine-containing gas is one selected from the group consisting of $NF_3$, $SF_6$, $C_2F_6$, or $CF_4$.

7. The method of claim 1, wherein the chlorine containing gas is selected from the group consisting of $Cl_2$ and HCl.

8. The method of claim 1, wherein the ratio of the nitrogen-containing gas to the fluorine-containing gas is between about 7 to about 9.

9. The method of claim 1, wherein the reduced etch rate micro-loading is about greater than 0% and up to about 20%.

10. The method of claim 1, wherein the reduced etch rate micro-loading is about greater than 0% and up to about 10%.

11. A method for etching a layer formed on a patterned substrate, comprising:

providing a substrate into a plasma processing chamber with an RF power supply disposed above the plasma processing chamber, the RF power supply providing RF power between about 200 watts to about 1000 watts to generate an etch plasma, and a bias power supply coupled to a substrate support to provide direct current (DC) bias voltage between about 100 volts to about 300 volts to control direction and energy of ion bombardment toward the patterned substrate, wherein the patterned substrate is disposed on the substrate support, the substrate having a metal silicide layer formed thereon and a patterned mask defined over the metal silicide layer, wherein the metal silicide layer is part of a gate stack;

supplying an etching gas mixture of a $NF_3$ gas, a $Cl_2$ gas, an $N_2$ gas, and an $O_2$ gas to the plasma processing chamber, wherein a ratio of the $N_2$ gas to the $NF_3$ gas is between about 6 to about 10, a ratio of the fluorine-containing gas to the chlorine-containing gas being between about 0.5 to about 1.5 and a ratio of the fluorine-containing gas to the oxygen-containing gas being between about 5 to about 7; and generating the etch plasma in the plasma processing chamber using the supplied etching gas mixture to etch the metal silicide layer in regions not covered by the patterned mask, the patterned mask defining dense regions and isolated regions, wherein the generated plasma is configured to remove the metal silicide layer in the dense regions and the isolated regions at a reduced etch rate micro-loading to reduce gate oxide punch through of the gate stack.

12. The method of claim 11, wherein the ratio of the $N_2$ gas to the $NF_3$ gas between about 6 to about 10 reduces etch rate micro-loading.

13. The method of claim 11, wherein the total etching gas mixture flow is between about 150 sccm to about 600 sccm, the wafer temperature is between about 20° C. to about 75° C., the plasma processing chamber pressure is between about 3 mTorr to about 15 mTorr.

14. The method of claim 1, wherein the reduced etch rate micro-loading is about greater than 0% and up to about 10%.

15. The method of claim 11, wherein the bias power supply is an RF power supply that creates the DC bias voltage on the patterned substrate on the substrate support.

16. The method of claim 11, wherein the substrate support is an electrostatic chuck, which is controlled by a heater power supply.

* * * * *